(12) United States Patent
Wu et al.

(10) Patent No.: US 11,847,381 B2
(45) Date of Patent: Dec. 19, 2023

(54) THREE-DIMENSIONAL GRAPHICAL ANNOTATIONS WITH SEMANTIC ATTRIBUTES

(71) Applicant: Dassault Systemes SolidWorks Corporation, Waltham, MA (US)

(72) Inventors: Jun Wu, Bedford, MA (US); Nikhil Kulkarni, Acton, MA (US); Bhoome Piputbundit, Brooklyn, NY (US); Scott G. Stanley, Westwood, MA (US); Michael Kozikowski, Norfolk, MA (US)

(73) Assignee: DASSAULT SYSTEMES SOLIDWORKS CORPORATION, Waltham, MA (US)

(*) Notice: Subject to any disclaimer, the term of this patent is extended or adjusted under 35 U.S.C. 154(b) by 986 days.

(21) Appl. No.: 16/395,522

(22) Filed: Apr. 26, 2019

(65) Prior Publication Data

US 2019/0354639 A1 Nov. 21, 2019

Related U.S. Application Data

(60) Provisional application No. 62/674,231, filed on May 21, 2018.

(51) Int. Cl.
*G06F 30/00* (2020.01)
*G06F 16/901* (2019.01)
(Continued)

(52) U.S. Cl.
CPC ............... *G06F 30/00* (2020.01); *G06F 9/54* (2013.01); *G06F 16/901* (2019.01); *G06T 17/00* (2013.01)

(58) Field of Classification Search
CPC .......... G06F 30/00; G06F 9/54; G06F 16/901; G06T 17/00; G06T 2219/004
See application file for complete search history.

(56) References Cited

U.S. PATENT DOCUMENTS 6,445,974 B1* 9/2002 Malaugh ................. G06F 30/00
700/98
6,614,430 B1* 9/2003 Rappoport ........... G06V 30/1983
345/420

(Continued)

FOREIGN PATENT DOCUMENTS

| JP | 2002-157285 A | 5/2002 |
| JP | 2006-107510 A | 4/2006 |
| JP | 2019-204506 A | 11/2019 |

OTHER PUBLICATIONS

Ahmed et al. Interoperability of Product and Manufacturing Information Using Ontology Concurrent Engineering Research and Applications, vol. 23(3) pp. 265-278, 2015 (Year: 2015).*

(Continued)

*Primary Examiner* — Rehana Perveen
*Assistant Examiner* — Cuong V Luu
(74) *Attorney, Agent, or Firm* — Hamilton, Brook, Smith & Reynolds, P.C.

(57) ABSTRACT

Computer-aided design (CAD) models, and associated methods and systems, including topological and geometrical entities, graphical annotation information, and data structures storing non-native format semantic annotation information. Associated application programming interfaces (APIs) can include routines to return non-native format semantic annotation information stored in data structures associated with a native format CAD model. The APIs can include routines to identify whether annotations include data structures storing non-native format semantic annotation information, and to identify the types of the annotations.

(Continued)

Graphical annotations can serve graphical display needs, while the semantic meanings from non-native CAD formats can be stored in placeholder data structures and, thus, be preserved. Manufacturing software applications can consume and act upon the semantic data via an API, thus, achieving automation benefits.

20 Claims, 5 Drawing Sheets

(51) Int. Cl.
  *G06F 9/54* (2006.01)
  *G06T 17/00* (2006.01)

(56) References Cited

U.S. PATENT DOCUMENTS

| | | | |
|---|---|---|---|
| 6,847,384 B1* | 1/2005 | Sabadell | G06F 16/258 703/2 |
| 2003/0163604 A1* | 8/2003 | Rabinovich | G06T 17/10 719/331 |
| 2015/0347366 A1 | 12/2015 | Irwin | |
| 2018/0101635 A1 | 4/2018 | Guillou et al. | |

OTHER PUBLICATIONS

European Search Report for EP 19 17 5263 dated Oct. 10, 2019, titled "Three-Dimensional Graphical Annotations With Semantic Attributes".

Anonymous, "AD Converter—CoreTechnologie", Dec. 17, 2017. https://web.archive.org/web/2017120707 5047/https://www.coretechnologie.com/produ cts/3d-evolution/cad-converter.htm.

Anonymous: "3D Evolution CAD Interoperatbility Software Suite Brochure" Dec. 17, 2017. https://web.archive.org/web/2017120707 5047/http://www.coretechnologie.com/filead min/content/Broschueren/3D -Evolution Broch ure EN.pdf.

Chunlei, L., et al. "Progress with OntoCAD: Standardised Ontological Annotation Approach to CAD Systems", Product Lifecycle Management Virtual Product Lifecycles for Green Products and Servicesproceedings of the PLMII Conference Held at the Eindhoven University of Technology, The Netherlands, Jul. 11-13, 2011, Jul. 11, 2011 (Jul. 11, 2011), pp. 364-374.

* cited by examiner

THREE-DIMENSIONAL GRAPHICAL ANNOTATIONS WITH SEMANTIC ATTRIBUTES

RELATED APPLICATION(S)

This application claims the benefit of U.S. Provisional Application No. 62/674,231, filed on May 21, 2018. The entire teachings of the above application are incorporated herein by reference.

BACKGROUND

Computer-aided design (CAD) software allows a user to construct and manipulate complex three-dimensional (3D) models. A number of different modeling techniques can be used to create a 3D model. One such technique is a solid modeling technique, which provides for topological 3D models where the 3D model is a collection of interconnected topological entities (e.g., vertices, edges, and faces). The topological entities have corresponding supporting geometrical entities (e.g., points, trimmed curves, and trimmed surfaces). The trimmed surfaces correspond to the topological faces bounded by the edges. CAD systems may combine solid modeling and other modeling techniques, such as parametric modeling techniques. Parametric modeling techniques can be used to define various parameters for different features and components of a model, and to define relationships between those features and components based on relationships between the various parameters.

A design engineer is a typical user of a 3D CAD system. The design engineer designs physical and aesthetic aspects of 3D models, and is skilled in 3D modeling techniques. The design engineer creates parts and may assemble the parts into a subassembly. A subassembly may also consist of other subassemblies. An assembly is designed using parts and subassemblies. Parts and subassemblies are hereinafter collectively referred to as components.

The following are definitions of certain terms that can be used when describing a 3D CAD system.

- Annotation: A callout to convey product and manufacturing requirements and instructions, such as notes, datum symbols, geometric dimensions and tolerances, weld symbols, surface finishes, etc. An annotation can be attached to and associated with a 3D model or displayed separately from a 3D model, commonly referred to as a 3D annotation. A 3D annotation can be displayed graphically for human eye readings, and can also represent semantic meanings beyond the graphical presentation.
- Assembly: A document in which parts, features, and other assemblies (subassemblies) are mated together. Parts and subassemblies can exist in documents separate from the assembly. For example, in an assembly, a piston can be mated to other parts, such as a connecting rod or cylinder. This assembly can then be used as a subassembly in an assembly of an engine.
- Body: A solid body includes topological data and geometric data. The topological data (e.g., faces, edges, and vertices) in a solid body have corresponding geometric data in the same solid body. Each vertex corresponds to a point. Each edge corresponds to a curve. Each face corresponds to a surface. An example multibody part for a wheel can include an axle body, rim body, and a number of spoke bodies to connect the axle and rim bodies.
- Component: Any part or subassembly within an assembly.
- Edge: A single outside boundary of a feature.
- Entity: A discrete element, such a face, edge, vertex, etc.
- Face: A selectable area (planar or otherwise) of a model or surface with boundaries that help define the shape of the model or surface. For example, a rectangular solid has six faces, and a cylindrical solid has three faces.
- Feature: An individual shape that, combined with other features, makes up a part or assembly.
- Large Design Review: A mode of assembly review that allows a very large assembly to open quickly, while still retaining capabilities that are useful when conducting design reviews of assemblies. In large design review mode, a use can: Navigate a design tree of the assembly, measure distances, create cross sections, hide and show components, and create, edit, and play back walk-throughs. Large design review mode can also be referred to as "Graphics Mode."
- Lightweight: A part in an assembly that has only a subset of its model data loaded into memory. The remaining model data is loaded on an as-needed basis. Lightweight improves performance of large and complex assemblies.
- Mate: A geometric relationship between entities (e.g., parts or bodies) in an assembly. Example mates include angle, coincident, concentric, distance, parallel, perpendicular, and tangent.
- Part: A single 3D object made up of features. A part can include multiple bodies. A part can become a component in an assembly. Examples of parts include, for example, a bolt, pin, and plate.
- Plane: A flat construction geometry.
- Point: A singular location in a 3D model.
- Resolved: A state of an assembly component in which it is fully loaded in memory. When resolved, all of the component's model data is available, so its entities can be selected, referenced, edited, used in mates, etc.
- Subassembly: An assembly that is part of a larger assembly. For example, a steering mechanism of a car is a subassembly of the car.
- Surface: A zero-thickness planar or 3D entity with edge boundaries.
- Vertex: A point at which two or more edges intersect. Vertices can be selected for sketching, dimensioning, and many other CAD operations.

A solid modeling system may be a feature-based 3D CAD system wherein a part is constructed using various features. Examples of features include bosses, fillets, chamfers, cuts, holes, shells, lofts, and sweeps. CAD systems store the contents of parts, subassemblies, and assemblies in a data file. In addition to features, the contents of CAD data files may include design profiles, layouts, internal components (e.g., bodies), and graphical entities.

There is a growing number of software applications that can automate manufacturing procedures by acting upon 3D annotations integrated into 3D CAD models. These applications include Computer Aided Manufacturing (CAM), Coordinate Measuring Machines (CMM) for inspection, cost estimations, tolerance stack-up optimizations, Computer-Aided Process Planning (CAPP), and so on. Manufacturing procedure time can be shortened from hours to minutes due to the automations. However, these valuable automations can be rendered unfeasible if semantic meanings of the 3D annotations are lost when importing a CAD model from one CAD format to another.

SUMMARY

The disclosed systems and methods include an Application Programming Interface (API) layer for accessing semantic attribute placeholders (e.g., data structures) for imported 3D graphical annotations. As a result, the graphical annotations can serve the human eye consumption needs, while the semantic meanings from non-native CAD formats can be populated into the placeholders and, hence, be preserved. Then, manufacturing software applications can consume and act upon the semantic data via the API. Hence, the aforementioned automation benefits can be achieved. Not only is the CAD design process improved, but the functionality of manufacturing systems is also improved.

An example embodiment is a CAD model that includes topological and geometrical entities, graphical annotation information, and data structures storing non-native format semantic annotation information. The types of semantic annotation information can include, for example, dimension, datum, and geometric dimension and tolerancing information. There may be a data structure for each type of semantic annotation information. Each data structure can include a list of annotation instances for a given type of semantic annotation information. Each annotation instance in a list of annotation instances, for a given type of semantic annotation information, can include data specific to the type of semantic annotation information.

Another example embodiment is a method of preserving semantic annotation information of CAD annotations from a non-native format CAD model. The example method includes creating a native format CAD model from the non-native format CAD model, parsing the non-native CAD model to determine annotations associated with features or components of the non-native CAD model, and determining graphical annotation information and semantic annotation information for the annotations. The graphical annotation information is added to the native format CAD model, and the semantic annotation information is stored with the native format CAD model in data structures associated with the graphical annotation information. The native format CAD model can be displayed with the graphical annotation information.

Another example embodiment is a system for preserving semantic annotation information of CAD annotations from a non-native format CAD model. The example system includes memory, an interface, and a processor in communication with the memory and interface. The processor is configured to create a native format CAD model from the non-native format CAD model, parse the non-native CAD model to determine annotations associated with features or components of the non-native CAD model, and determine graphical annotation information and semantic annotation information for the annotations. The graphical annotation information is added to the native format CAD model, and the semantic annotation information is stored with the native format CAD model in data structures associated with the graphical annotation information. The native format CAD model can be displayed with the graphical annotation information.

Another example embodiment is an application programming interface (API) including routines configured to return non-native format semantic annotation information stored in data structures associated with a native format computer-aided design (CAD) model. The API can include a routine configured to identify whether an annotation of the native format CAD model includes a data structure storing non-native format semantic annotation information, and a routine configured to identify a type of an annotation of the non-native format semantic annotation information.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

Figure 1:
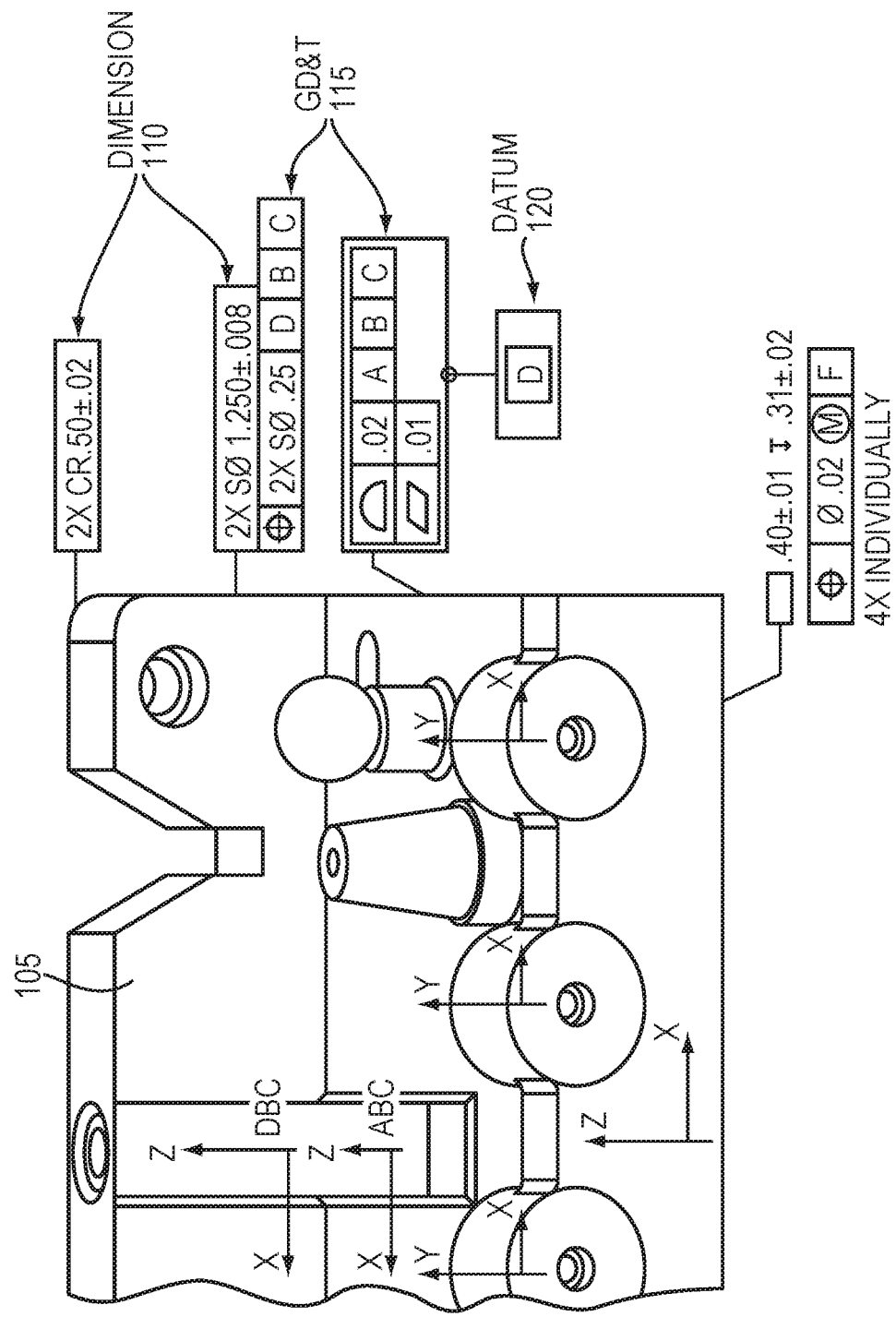
FIG. 1 illustrates examples of Product Manufacturing Information (PMI) annotations.

A description of example embodiments follows.

Three-dimensional (3D) annotation usage in CAD models is growing substantially. According to a multiple-year survey question, 25% of CAD users are using or planning to use 3D annotated models in the next three years. This is strong growth from 1.5% in 2009, 16% in 2013, and 20% in 2015.

A benefit of 3D annotations is to empower software applications to automate manufacturing procedures, but CAD data exchange is a frequent challenge in manufacturing collaborations. When importing CAD data from non-native CAD formats, actionable semantic meanings of the 3D annotations are lost. It is expensive and error-prone for users to manually reconstruct native 3D annotations with semantic meanings according to hundreds, or even thousands, of foreign CAD definitions. Further, it is difficult and time-consuming for development teams to build and perfect software algorithms to automatically reconstruct the native 3D annotations according to foreign CAD definitions. Either manually by users or automatically by software algorithms, the reconstruction is constrained by current 3D annotation tools, so users must often wait for tool enhancements before certain types of foreign annotations can be reconstructed. Such reconstructions also cannot preserve 100% of the original foreign CAD semantics due to 3D annotation discrepancies between CAD systems. 3D annotation semantic discrepancies can include, but are not limited to, customized symbols, unique relationships between annotations, unique associations between annotations and defined features, and special Geometric Dimensioning and Tolerancing (GD&T) modifiers. Because of this, current CAD systems may import only graphical 3D annotations. However, manufacturing software applications integrated with such CAD systems cannot consume, analyze, or act upon graphical 3D annotations. Therefore, in collaborations between a client using one CAD system and a supplier using another CAD system, the benefits of manufacturing automations based on 3D annotations cannot be achieved.

The attribute data structures associated with the graphical annotations are not constrained by native CAD annotation tools. Users or CAD tools do not need to reconstruct the 3D annotations, since the semantic meaning of the annotations can still be acted on by manufacturing software applications. It does not matter how rich or limited a CAD system's native 3D annotations are, because the semantic meaning is preserved and conveyed implicitly regardless of the native tools. The differences and discrepancies between CAD systems also do not matter. Further, separate attributes can have specific relationships between them. These relationships may be needed to convey more cohesive and intelligent manufacturing logics. Because of the data structures and API for obtaining semantic information from the data structures, these relationships can be well preserved and passed along, even though the native annotation tools may not be able to manipulate them.

The following describes these issues and example solutions in the context of the SOLIDWORKS® CAD system.

In the world of manufacturing, providing concise and accurate dimensioning and tolerance information is vitally important to facilitate part creation. The aspects that specifically relate to SOLIDWORKS are Computer-Aided Manufacturing (CAM) and Numerical Control (NC). Third-party add-in partners, such as, for example, MasterCAM, CAMWorks, and SolidCAM, rely on accurate Product Manufacturing Information (PMI) contained in models to aid in part manufacturing. Currently in SOLIDWORKS, PMI information can be displayed in the form of dimensions and tolerances and most commonly Geometric Dimensioning & Tolerancing (GD&T). GD&T is a standard used by many companies to define part geometry.

FIG. 1 illustrates examples of Product Manufacturing Information (PMI) annotations. FIG. 1 shows a model of a part 105 with multiple features. PMIs annotations are added to the model. PMI annotation 110 is an example of a dimension PMI annotation. PMI annotation 115 is an example of a GD&T PMI annotation. PMI annotation 120 is an example of a datum PMI annotation.

Currently, SOLIDWORKS is capable of displaying PMI information in the form of GD&T annotations in DimXpert and SOLIDWORKS MBD. However, an issue exists with models created outside of SOLIDWORKS and exported in a neutral format. This neutral format is called STEP 242 and contains PMI. The format can be created by many CAD packages other than SOLIDWORKS. A problem can occur when importing these STEP 242 models into SOLIDWORKS. The PMI information may be unable to be accessed programmatically. Past improvements were made in SOLIDWORKS to be able display the GD&T information on screen. However, this is graphical PMI; the geometric tolerances (Gtols) and dimensions are essentially "dummy" GD&T that could not be queried programmatically for the underlying information. For this PMI information to be truly useful to CAM applications and automation techniques, the corresponding semantic PMI (software readable) should be provided.

The systems and methods disclosed herein provide new CAD model data structures and Application Programming Interfaces (APIs) to allow API users to query an imported file and obtain all the PMI information contained within the model. In the example scenario, the model can be a STEP 242 file imported into SOLIDWORKS as a part. Since an end result may be to facilitate manufacturing, assemblies (usually not manufactured as a unit; individual parts are made and then later assembled) and drawings do not have to factor into the API.

It can be assumed that each GD&T in the imported file has an associated IAnnotation. This assumption allows existing APIs (IModelDoc2::GetFirstAnnotation, IAnnotation::GetNext3, etc.) to be used to traverse the model to obtain the IAnnotation objects, and from there, the PMI information. The Annotation object can also provide the means to get the attached entities that the PMI data references.

Once a specific PMI object is obtained from the IAnnotation object, methods and properties under each specific PMI object can be provided in the interface to allow the user to query the PMI data.

In a specific example, there can be three main types of GD&T PMI data that may be addressed by the API. Dimensions, Gtols, and Datums (see picture above). Each PMI type can be represented by its own object that contains data specific to that type. There can be additional types, in which case a new interface can be added that represents the new type.

The PMI object can exist separately from the underlying annotation object. This means that the annotation object can contain specific lower level objects as well as PMI data. For example, for an Annotation, GetType and GetSpecificAnnotation can indicate that the underlying object is a Gtol. However, the Annotation can also contain PMI information separate from the Gtol data (and in many cases the PMI and Gtol data may be redundant). This avoids the situation where an annotation can only have Gtol data or PMI data. The intent here is to provide PMI data regardless of the annotation type (Gtol data and PMI data, if available). As mentioned previously, imported files may have annotations that do not fall under any specific underlying object category and, thus, can be "dummy" annotations. This disclosed implementation provides more flexibility because the PMI data is not reliant on the underlying annotation object.

Figure 2:
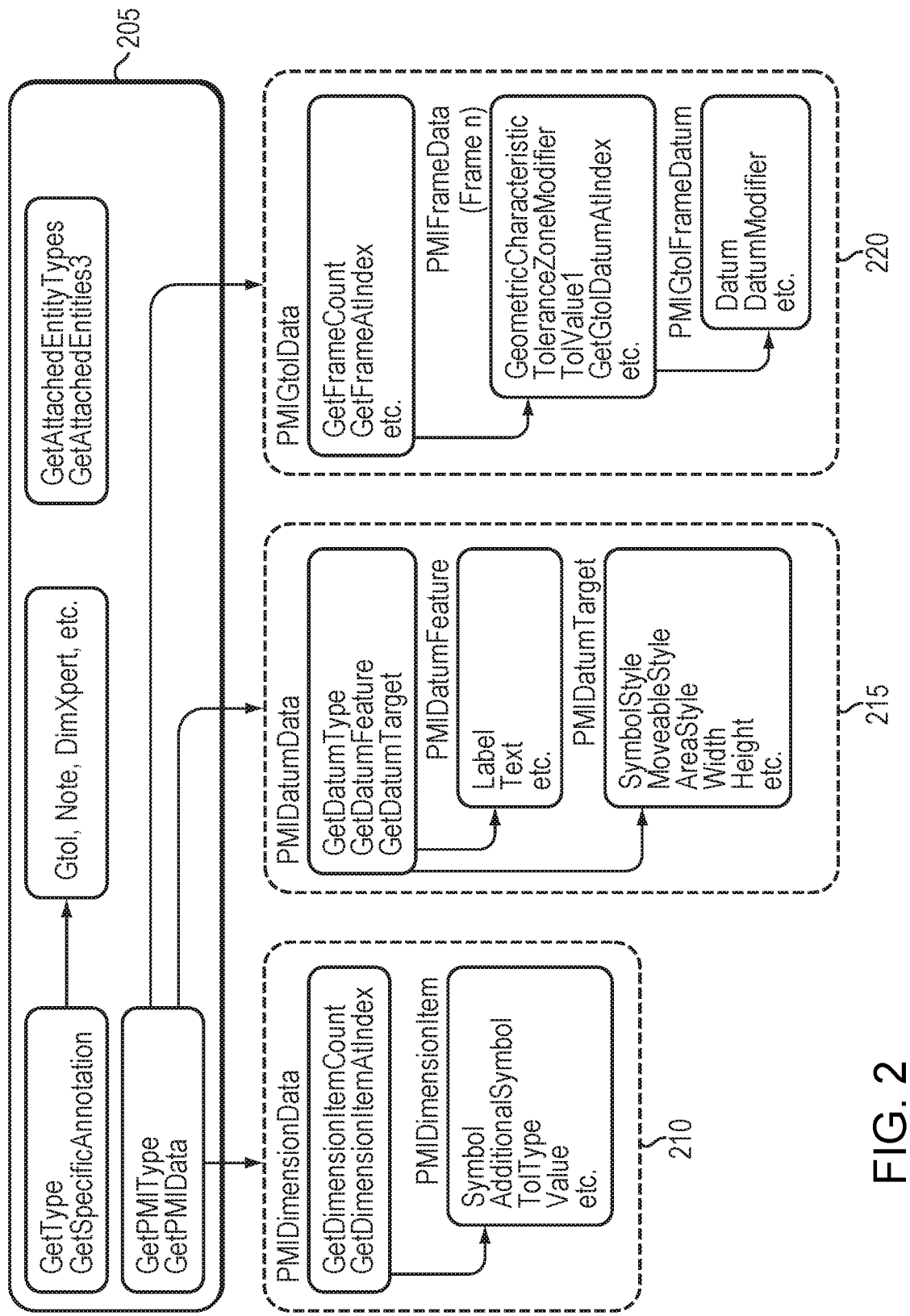
FIG. 2 illustrates existing and new methods of an IAnnotation interface.

FIG. 2 illustrates existing and new methods of an IAnnotation interface. The top section 205 of FIG. 2 represents existing methods (GetType, GetSpecificAnnotation, GetAttachedEntityTypes, and GetAttachedEntities3) in the IAnnotation interface; existing methods can be used to get the referenced entities. New methods are added to IAnnotation to get the PMI type (GetPMIType) and specific PMI data object (GetPMIData). The bottom section of FIG. 2 represents three new interfaces 210, 215, 220, each one representing a PMI type. Each object type can include data relevant to that object. In the case of a Gtol object type, there can be one or more frames with data.

The following are details of an example API according to the disclosed systems and methods.

(1) Modify existing enum swAnnotationType_e and add a new member swNone swPMIOnly. This enum is returned if the annotation is the aforementioned "dummy" annotation.

(2) Modify the existing method IAnnotation::GetType to return swAnnotationType_e.swPMIOnly if the annotation only contains PMI annotation and is, thus, a "dummy" annotation.

(3) Ensure that the existing method IAnnotation::GetSpecificAnnotation returns NULL if the annotation only contains PMI information and no underlying object associated to the annotation.

(4) Add a new enum swPMIType_e. These are example of PMI types that may initially be supported.

```
enum swPMIType_e
    {  swPMIType_None = 0,
       swPMIType_Dimension,
       swPMIType_Datum,
       swPMIType_GTol,
       swPMIType_Unknown
    }
```

(5) Add a new method IAnnotation::GetPMIType with valid return values contained in swPMIType_e. If no PMI data is associated with this annotation, return swPMIType_None.

(6) Add a new method IAnnotation::GetPMIData. This method behaves essentially the same way as IAnnotation::GetSpecificAnnotation except the only possible return object is a PMI data object either of a dimension, datum, or Gtol (PMIDimensionData, PMIDatumData, PMIGTolData). If there is no PMI data associated with this annotation, this method returns NULL.

(7) Add a new interface PMIDimensionData that contains all the relevant PMI information for the dimension type:

Since a dimension can contain multiple instances (items) (similar to a Gtol with multiple frames), PMIDimensionData can contain methods to retrieve the number of items and a method to retrieve the item at a particular index.

These may be referred to herein as "DimensionItems" in addition to "instances" because there is also an "instance count" that denotes something different.

Interface PMIDimensionData:
Methods:
    Function GetDimensionItemCount( ) as Long
        Returns the total number of dimension items.
    Function GetDimensionItemAtIndex( ) as PMIDimensionItem
        Returns a PMIDimensionItem object representing an instance.
        Zero indexed.

Interface PMIDimensionItem:
Properties:

| | |
|---|---|
| Long | Symbol (swDimensionSymbol_e) |
| Long | Additional Symbol (swToleranceZoneModifier_e) |
| Long | TolType (uses existing swTolType_e) |
| Double | Value |
| Double | MaxVariation (formerly TolSup) |
| Double | MinVariation (formerly TolInf) |
| Long | Unit (swPMIUnit_e) |
| Long | ValuePrecision |
| Long | TolerancePrecision |
| Double | Value2 |
| Double | MaxVariation2 |
| Double | MinVariation2 |
| Long | Unit2 |
| Long | ValuePrecision2 |
| Long | TolerancePrecision2 |
| String | Prefix |
| String | Suffix |
| Long | InstanceCount (i.e., 1X, 2X, 4X) |
| String | DimensionText |

(8) Add a new interface PMIDatumData that contains all the relevant PMI information for the datum type. There are two datum types: datum feature and datum target.

Figure 3A:
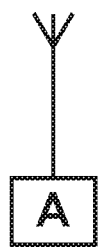
FIG. 3A illustrates an example of a datum feature.
Figure 3B:
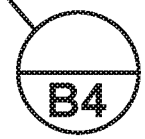
FIG. 3B illustrates an example of a datum target.

FIG. 3A illustrates an example of a datum feature. Only text can be inside the datum feature. FIG. 3B illustrates an example of a datum target. The round datum target can have text in an upper or lower section or both.

Interface PMIDatumData:
Method:
    Function GetDatumType as Long
        Returns whether it's a datum feature or datum target, swPMIDatumType_e.
    Function GetDatumFeature as PMIDatumFeature
        Returns a PMIDatumFeature object.
        Call this if the datum type is swPMIDatumType_DatumFeature.
    Function GetDatumTarget as PMIDatumTarget
        Returns a PMIDatumTarget object.
        Call this if the datum type is swPMIDatumType_DatumTarget.

Interface PMIDatumFeature:
Properties:

| | |
|---|---|
| String | Label |
| String | Text |
| Long | Shape (swPMIDatumShape_e) |
| Long | LeaderAnchorStyle (swPMIDatumAnchorStyle_e) |
| Double | LeaderBendLength |

Interface PMIDatumTarget:
Properties:
    Long SymbolStyle (swPMIDatumTargetSymbolStyle_e)
    Long Movable Style (swPMIDatumTargetMovableStyle_e)
    Long AreaStyle (swPMIDatumTargetAreaStyle_e)
    Double Width (applicable for rectangular target area)
    Double Height (applicable for rectangular target area)
    Double Diameter (applicable for circular or X target area)
Methods:
    Function GetDatumTargetReferences as Object
        Gets an array of strings that represent the datum references.

Figure 4:
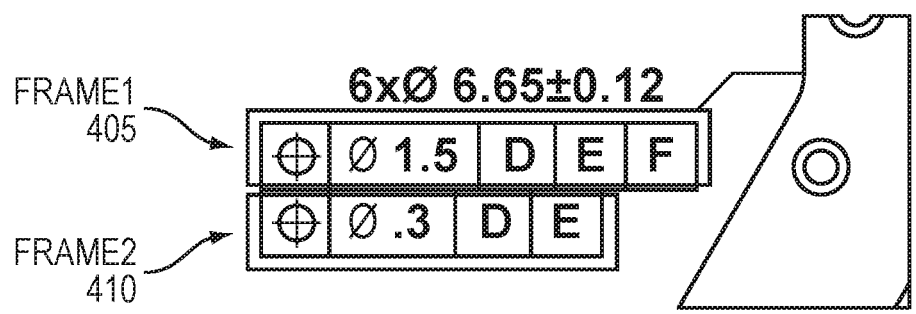
FIG. 4 illustrates an example of a combined geometric tolerance (Gtol).
Figure 5:
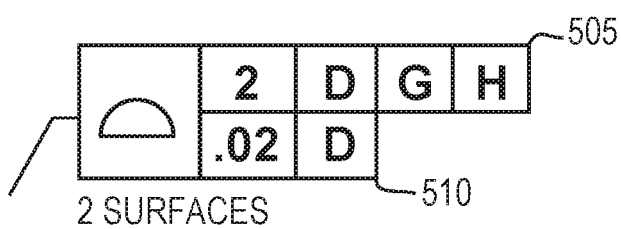
FIG. 5 illustrates an example of a composite Gtol.

(9) Add a new interface PMIGtolData that contains all the relevant PMI information for the Gtol type. Note that Gtol data is different than the previous types. Gtols can contain single or multiple frames attached to a single leader. In the case of multiple frames, the Gtol is considered composite or combined. The format of each frame is similar; there is a geometric characteristic in the first box followed by the tolerance value and optional modifiers. Then the final sections can contain, for example, up to three datums (primary, secondary, and tertiary). For example, FIG. 4 illustrates a combined geometric tolerance (Gtol). The combined Gtol has two frames 405, 410. Both frames 405, 410 have the geometric characteristic of "position." The tolerance value for frame 1 (405) is 1.5 and has a tolerance zone modifier of "diameter." Frame 1 (405) has three datums while frame 2 (410) only has two. FIG. 5 illustrates an example of a composite Gtol with two frames 505, 510. Both frames 505, 510 have the geometric characteristic of "Surface Profile."

Figure 6:
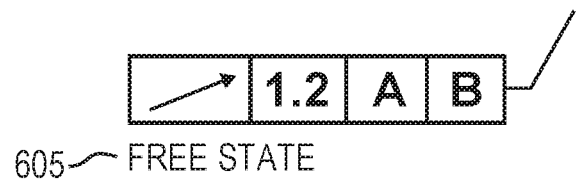
FIG. 6 illustrates an example of a Gtol with additional text.
Figure 7:
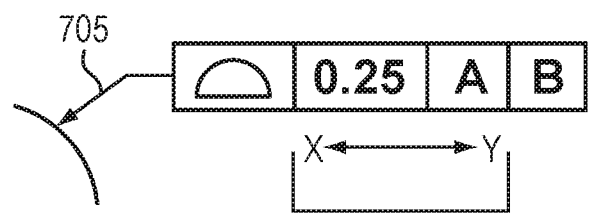
FIG. 7 illustrates an example of a Gtol with a label that denotes a point at which a tolerance value applies.
Figure 8:
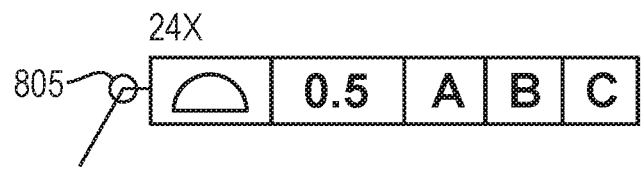
FIG. 8 illustrates an example of a Gtol with a leader symbol.

Gtols can also have the following aspects:
    a. Prefix and bottom additional text—Gtols can have additional text, below, of the frames. For example, FIG. 6 illustrates a Gtol with additional text 605. Also, a Gtol can contain labels that denote points at which the tolerance value applies. For example, FIG. 7 illustrates a Gtol with a label 705 that denotes a point at which a tolerance value applies.
    b. Custom Symbols—It is possible that Gtol frames contain custom symbols that are not any of the standard GD&T symbols.
    c. Leader Symbols—Gtols can contain special symbols on their leader lines. For example, FIG. 8 illustrates a Gtol with a leader symbol 805 that is a circle denoting "All Around."

A PMIGTolData object can contain frame data along with methods to access individual frames. The user can call GetNextFrame or GetFrameAtIndex to obtain any additional frames.

Interface PMIGTolData:
Properties:

| | | |
|---|---|---|
| Long | LeaderType (swPMILeaderType_e) | |
| Long | LeaderStyle (swPMILeaderStyle_e) | |
| Long | LeaderLocation (swPMILeaderLocation_e) | |
| Long | LeaderModifier (swPMILeaderModifier_e) | |
| Long | InstanceCount | |

Figure 9:
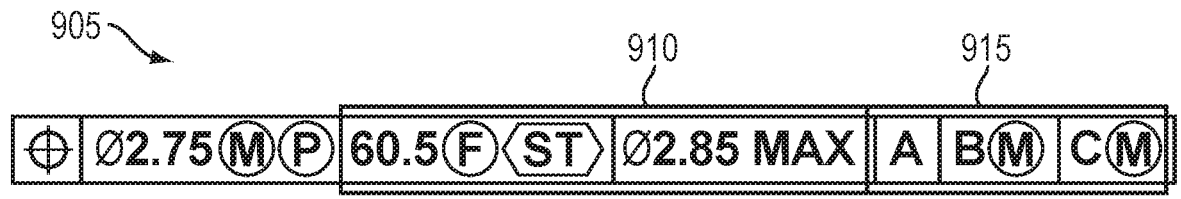
FIG. 9 illustrates a frame with two entities containing a tolerance.

Methods:
  Function IsComposite( ) as Boolean
    This method returns true if the Gtol is a Composite, false otherwise.
  Function GetFrameCount( ) as Long
    Returns the total number of frames in this Gtol.
  Function GetFrameAtIndex( ) as PMIFrameData
    This method returns a PMIFrameData object representing a frame in the Gtol. Frames are zero indexed, the first frame is Frame 0, etc.
  Function GetTextBelowFrames( ) as String
    This method returns the text below the frames.
  Function GetFirstPoint( ) as String
    This method returns the first point (left side).
  Function GetSecondPoint( ) as String
    This method returns the second point (right side).
  Function GetText( ) as String
    This method returns the text associated with the Gtol.
(10) Add a new interface PMIFrameData.
Interface PMIFrameData:
Properties:
  Long GeometricCharacteristic
    (i.e., perpendicularity, flatness, position, etc. valid values contained in swGeometricCharacteristic_e)
  Long FrameNumber
    This value is zero based, the first frame is Frame 0, etc.
Methods:
  Function GetGtolBoxCount as Long
    A box represents an entity within a frame that contains tolerance information.
    (FIG. 9 illustrates a frame 905 with two boxes 910, 915. In the example of FIG. 9, the method returns 2 as the count.)
  Function GetGtolBoxAtIndex as PMIGtolBoxData
    Returns a PMIGtolBoxData object.
    Zero based index to the box the user wants to retrieve.
  Function GetGtolDatumCount as Long
    Each frame can have 1-3 (or more) datums.
  Function GetGtolDatumAtIndex as PMIGtolFrameDatum
    Returns a PMIGtolFrameDatum object.
    Pass in a zero based index to the datum the user wants to retrieve.
Interface PMIGtolBoxData
Properties:

| | |
|---|---|
| Long | ToleranceZoneModifier |
| | Valid values contained in swToleranceZoneModifier_e |
| Long | MaterialModifier |
| | Valid values contained in swMaterialModifier_e |
| Long | Unit (swPMIUnit_e) |
| Double | TolValue |
| Long | TolerancePerUnitType (swPMITolPerUnitAreaType_e) |
| Double | TolerancePerUnitValue1 |
| Double | TolerancePerUnitValue2 |

Methods:
  Function GetAdditionalSymbols as Object
    Returns an array of longs;
    Valid values contained in swAdditionalSymbol_e.
  Function GetTolTypes as Object
    Returns an array of longs; valid values contained in swGtolTolType_e.
  Function GetTolTypeValues as Object
    Returns an array of doubles that correspond to the TolType.
Interface PMIGtolFrameDatum
Properties:

| | |
|---|---|
| String | Datum |
| Long | DatumModifier (swMaterialModifier_e) |
| Double | DatumModifierValue |
| String | DatumLinked1 |
| Long | DatumLinkedModifier1 (swMaterialModifier_e) |
| Double | DatumLinkedModifierValue1 |
| String | DatumLinked2 |
| Long | DatumLinkedModifier2 (swMaterialModifier_e) |
| Double | DatumLinkedModifierValue2 |

The following new enumerations can be created to support the new interfaces:

```
Enum swDimensionSymbol_e
{
    swDimensionSymbol_None = 0,
    swDimensionSymbol_Unknown,
    swDimensionSymbol_Diameter,
    swDimensionSymbol_Depth,
    swDimensionSymbol_Degree,
    swDimensionSymbol_Centerline,
    swDimensionSymbol_CenterOfMass,
    swDimensionSymbol_Counterbore,
    swDimensionSymbol_Countersink,
    swDimensionSymbol_ConicalTaper,
    swDimensionSymbol_Continuous,
    swDimensionSymbol_ControlledRadius,
    swDimensionSymbol_Delta,
    swDimensionSymbol_Encompassing,
    swDimensionSymbol_FlattenedLength,
    swDimensionSymbol_FreeState,
    swDimensionSymbol_Independency,
    swDimensionSymbol_LeastMaterialCondition,
    swDimensionSymbol_MaximumMaterialCondition,
    swDimensionSymbol_PartingLine,
    swDimensionSymbol_PlusMinus,
    swDimensionSymbol_ProjectedToleranceZone,
    swDimensionSymbol_RegardlessOfFeatureSize,
    swDimensionSymbol_Rho,
    swDimensionSymbol_SlopeUp,
    swDimensionSymbol_SlopeDown,
    swDimensionSymbol_SlopeInvertedUp,
    swDimensionSymbol_SlopeInvertedDown,
    swDimensionSymbol_SphericalRadius,
    swDimensionSymbol_SphericalDiameter,
    swDimensionSymbol_Square,
    swDimensionSymbol_SquareBS,
    swDimensionSymbol_Statistical,
    swDimensionSymbol_TangentPlane,
    swDimensionSymbol_Translation,
    swDimensionSymbol_UnequallyDisposedProfile
}
Enum swPMIDatumType_e
{
    swPMIDatumType_DatumFeature
    swPMIDatumType_DatumTarget
}
Enum swPMIDatumShape_e
{
    swPMIDatumShape_Square = 0,
    swPMIDatumShape_Round
}
```

```
Enum swPMIDatumAnchorStyle_e
{
    swPMIDatumAnchorStyle_FilledTriangle = 0,
    swPMIDatumAnchorStyle_FilledTriangleWithShoulder,
    swPMIDatumAnchorStyle_EmptyTriangle,
    swPMIDatumAnchorStyle_EmptyTriangleWithShoulder
}
Enum swPMIDatumTargetSymbolStyle_e
{
    swPMIDatumTargetSymbolStyle_None = 0,
    swPMIDatumTargetSymbolStyle_Unknown,
    swPMIDatumTargetSymbolStyle_Symbol,
    swPMIDatumTargetSymbolStyle_AreaOutside
}
Enum swPMIDatumTargetMovableStyle_e
{
    swPMIDatumTargetMovableStyle_None = 0,
    swPMIDatumTargetMovableStyle_Unknown,
    swPMIDatumTargetMovableStyle_Horizontal,
    swPMIDatumTargetMovableStyle_Rotational
}
Enum swPMIDatumTargetAreaStyle_e
{
    swPMIDatumTargetAreaStyle_None = 0,
    swPMIDatumTargetAreaStyle_Unknown,
    swPMIDatumTargetAreaStyle_X,
    swPMIDatumTargetAreaStyle_Circular,
    swPMIDatumTargetAreaStyle_Rectangular
}
Enum swGeometricCharacteristic_e
{
    swGeometricCharacteristic_None = 0,
    swGeometricCharacteristic_Unknown,
    swGeometricCharacteristic_Straightness,
    swGeometricCharacteristic_Flatness,
    swGeometricCharacteristic_Circularity,
    swGeometricCharacteristic_Cylindricity,
    swGeometricCharacteristic_LineProfile,
    swGeometricCharacteristic_SurfaceProfile,
    swGeometricCharacteristic_Angularity,
    swGeometricCharacteristic_Parallelism,
    swGeometricCharacteristic_Perpendicularity,
    swGeometricCharacteristic_Position,
    swGeometricCharacteristic_Concentricity,
    swGeometricCharacteristic_Symmetry,
    swGeometricCharacteristic_CircularRunout,
    swGeometricCharacteristic_TotalRunout
}
Enum swToleranceZoneModifier_e
{
    swToleranceZoneModifier_None = 0,
    swToleranceZoneModifier_Unknown,
    swToleranceZoneModifier_Diameter,
    swToleranceZoneModifier_SphericalDiameter
}
Enum swMaterialModifier_e
{
    swMaterialModifier_None = 0,
    swMaterialModifier_Unknown,
    swMaterialModifier_MaximumMaterialCondition,
    swMaterialModifier_LeastMaterialCondition,
    swMaterialModifier_RegardlessOfFeatureSize,
    swMaterialModifier_Translation
}
Enum swAdditionalSymbol_e
{
    swAdditionalSymbol_None = 0,
    swAdditionalSymbol_Unknown,
    swAdditionalSymbol_TangentPlane,
    swAdditionalSymbol_FreeState,
    swAdditionalSymbol_Statistical,
    swAdditionalSymbol_MaximumUpperTolerance,
    swAdditionalSymbol_MinimumLowerTolerance
}
Enum swGtolTolType_e
{
    swGtolTolType_None = 0,
    swGtolTolType_Unknown,
    swGtolTolType_ProjectedTolerance,
    swGtolTolType_Square,
    swGtolTolType_UnequallyDisposedProfile
}
Enum swPMITolPerUnitAreaType_e
{
    swPMITolPerUnitType_None = 0,
    swPMITolPerUnitType_Unknown,
    swPMITolPerUnitType_Circular,
    swPMITolPerUnitType_Rectangular,
    swPMITolPerUnitType_Square
}
Enum swPMIUnit_e
```

// This enum is derived from swLengthUnits_e with angular units added.

```
{
    swPMIUnit_None = 0,
    swPMIUnit_ANGSTROM,
    swPMIUnit_CM,
    swPMIUnit_FEET,
    swPMIUnit_FEETINCHES,
    swPMIUnit_INCHES,
    swPMIUnit_METER,
    swPMIUnit_MICRON,
    swPMIUnit_MIL,
    swPMIUnit_MM,
    swPMIUnit_NANOMETER,
    swPMIUnit_UIN,
    swPMIUnit_DEGREE,
    swPMIUnit_RADIAN
}
Enum swPMILeaderType_e
{
    swPMILeaderType_NoLeader = 0,
    swPMILeaderType_Leader,
    swPMILeaderType_MultiJog
}
Enum swPMILeaderStyle_e
{
    swPMILeaderStyle_Straight = 0,
    swPMILeaderStyle_Bent,
    swPMILeaderStyle_Perpendicular
}
Enum swPMILeaderLocation_e
{
    swPMILeaderLocation_Left = 0,
    swPMILeaderLocation_Right,
    swPMILeaderLocation_Nearest
}
Enum swPMILeaderModifier_e
{
    swPMILeaderModifier_None = 0,
    swPMILeaderModifier_AllAround,
    swPMILeaderModifier_AllAroundThisSide,
    swPMILeaderModifier_AllOver,
    swPMILeaderModifier_AllOverThisSide
}
```

Figure 10:
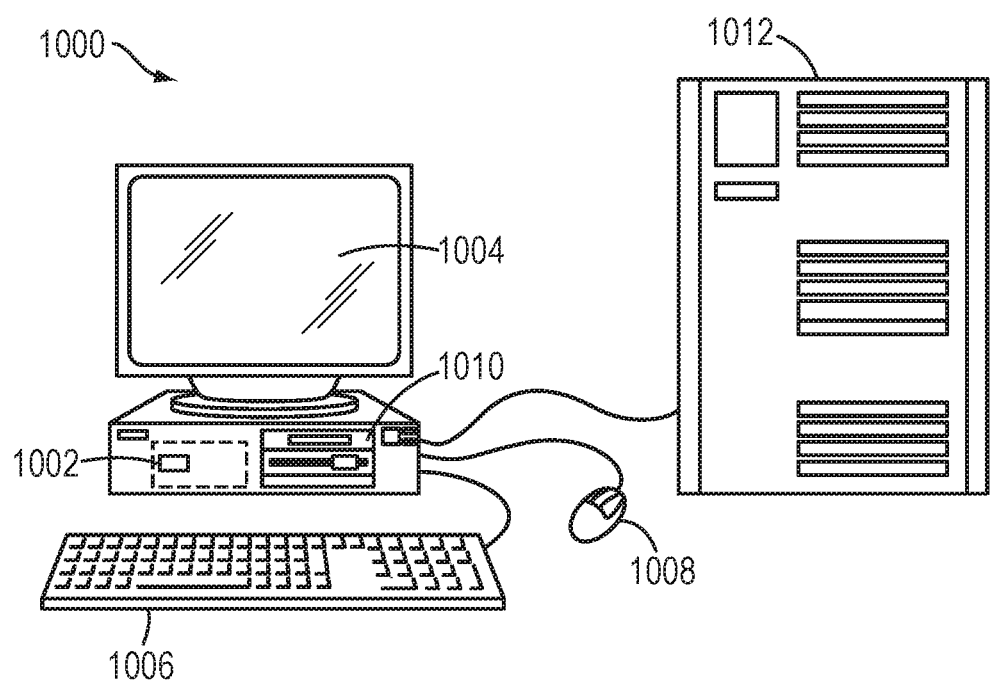
FIG. 10 is a schematic diagram of a computer system in which embodiments may be implemented.

FIG. 10 is a schematic diagram of a computer system in which embodiments may be implemented. FIG. 10 illustrates a computerized modeling system 1000 that includes a CPU 1002, a computer monitor 1004, a keyboard input device 1006, a mouse input device 1008, and a storage device 1010. The CPU 1002, computer monitor 1004, keyboard 1006, mouse 1008, and storage device 1010 can include commonly available computer hardware devices. For example, the CPU 1002 can include an Intel-based processor. The mouse 1008 may have conventional left and right buttons that the design engineer may press to issue a command to a software program being executed by the CPU 1002. As an alternative or in addition to the mouse 1008, the computerized modeling system 1000 can include a pointing device such as a trackball, touch-sensitive pad, or pointing device and buttons built into the keyboard 1006. Those of ordinary skill in the art appreciate that the same results described herein with reference to a mouse device can be achieved using another available pointing device. Other appropriate computer hardware platforms are suitable as will become apparent from the discussion that follows. Such computer hardware platforms are preferably capable of operating Microsoft Windows, UNIX, Linux, or MAC OS operating systems.

Additional computer processing units and hardware devices (e.g., rapid prototyping, video, and printer devices) may be included in the computerized modeling system 1000. Furthermore, the computerized modeling system 1000 may include network hardware and software, thereby enabling communication to a hardware platform 1012, and facilitating communication between numerous computer systems that include a CPU and a storage system, among other computer components.

Computer-aided modeling software may be stored on the storage device 1010 and loaded into and executed by the CPU 1002. The modeling software allows a design engineer to create and modify a 3D model and implements aspects of the embodiments described herein. The CPU 1002 uses the computer monitor 1004 to display a 3D model and other aspects thereof as described. Using the keyboard 1006 and the mouse 1008, the design engineer can enter and modify data associated with the 3D model. The CPU 1002 accepts and processes input from the keyboard 1006 and mouse 1008. The CPU 1002 processes the input along with the data associated with the 3D model and makes corresponding and appropriate changes to that which is displayed on the computer monitor 1004 as commanded by the modeling software. In one embodiment, the modeling software is based on a solid modeling system that may be used to construct a 3D model consisting of one or more solid and surface bodies.

Embodiments may be implemented in digital electronic circuitry, or in computer hardware, firmware, software, or in combinations thereof. Apparatuses may be implemented in a computer program product tangibly embodied in a machine-readable storage device for execution by a programmable processor; and method steps may be performed by a programmable processor executing a program of instructions to perform functions by operating on input data and generating output. Embodiments may advantageously be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; in any case, the language may be a compiled or interpreted language. Suitable processors include, by way of non-limiting example, both general and special purpose microprocessors. Generally, a processor receives instructions and data from a read-only memory and/or a random access memory and in some embodiments instructions and data may be downloaded through a global network. Storage devices suitable for tangibly embodying computer program instructions and data include all forms of non-volatile memory, including by way of example semiconductor memory devices, such as EPROM, EEPROM, and flash memory devices; magnetic disks, such as internal hard disks and removable disks; magneto-optical disks; and CD-ROM disks. Any of the foregoing may be supplemented by, or incorporated in, custom-designed ASICs (application-specific integrated circuits).

An advantage of the embodiments disclosed herein is that the layer of semantic attributes to the graphical 3D annotations can be consumed, analyzed, and acted upon by software applications to automate manufacturing procedures, even using imported foreign CAD models. These automations can save dozens of hours and thousands of dollars per model in model-based collaborations across the manufacturing procedures. Two separate needs are served separately and efficiently: for human eye consumptions, the existing graphical 3D annotations suffice; for software consumptions, the API layer of original semantic attributes work best. The semantic attributes can save weeks of time per model for users to manually reconstruct native 3D annotations just to carry over the semantic meanings. The well-preserved original attributes can avoid the human errors in data interpretations and reentry. The API path can help reallocate development resources into other more effective and efficient projects, rather than the difficult and thankless effort of building and perfecting automatic 3D annotation reconstruction algorithms. The API path of original semantic attributes is not constrained by 3D annotation discrepancies between CAD systems. However unique the information that comes from the source CAD data, the API layer can preserve it in existing placeholders or add new placeholders without altering native annotation tools.

While example embodiments have been particularly shown and described, it will be understood by those skilled in the art that various changes in form and details may be made therein without departing from the scope of the embodiments encompassed by the appended claims. For example, implementations may change the order in which operations are performed. Further, depending on the needs of an implementation, particular operations described herein may be implemented as a combined operation, eliminated, added to, or otherwise rearranged. Further, particular user interface operations relative to a mouse (e.g., click, drag, drop) are by way of illustration and not limitation. Other user interface operations for selecting, moving, placing, etc., model or design data are suitable.

While example embodiments have been particularly shown and described, it will be understood by those skilled in the art that various changes in form and details may be made therein without departing from the scope of the embodiments encompassed by the appended claims.

What is claimed is:

1. A method of preserving semantic product manufacturing information (PMI) annotation information of computer-aided design (CAD) annotations from a non-native format CAD model, the method comprising:

creating a native format CAD model from the non-native format CAD model;

parsing the non-native format CAD model to determine annotation objects associated with features or components of the non-native format CAD model;

identifying non-native format graphical PMI annotation information based on the determined annotation objects, wherein the non-native format graphical PMI annotation information is configured to visually present information to a user;

adding the identified non-native format graphical PMI annotation information to the native format CAD model; and preserving semantic PMI annotation information from the non-native format CAD model by:

querying the determined annotation objects, using an application programing interface (API), to obtain the semantic PMI annotation information, the semantic PMI annotation information (i) corresponding to the identified non-native format graphical PMI annotation information and (ii) including one or more software-readable semantic PMI annotation objects; and storing the semantic PMI annotation information in the native format CAD model in one or more data structures configured to maintain relationships between the semantic PMI annotation information and the corresponding identified non-native format graphical PMI annotation information.

2. A method as in claim 1 further comprising displaying the native format CAD model with the identified non-native format graphical PMI annotation information.

3. A method as in claim 1 wherein the one or more data structures include a data structure for each type of semantic PMI annotation information.

4. A method as in claim 3 wherein the types of semantic PMI annotation information include dimension, datum, and geometric dimension and tolerancing information.

5. A method as in claim 3 wherein each of the one or more data structures includes a list of annotation instances for a respective type of semantic PMI annotation information.

6. A method as in claim 5 wherein each annotation instance in a given list of annotation instances for a given type of semantic PMI annotation information includes data specific to the given type of semantic PMI annotation information.

7. A system for preserving semantic product manufacturing information (PMI) annotation information of computer-aided design (CAD) annotations from a non-native format CAD model, the system comprising:
  memory;
  an interface; and
  a processor in communication with the memory and interface, the processor configured to:
    create a native format CAD model from the non-native format CAD model;
    parse the non-native format CAD model to determine annotation objects associated with features or components of the non-native format CAD model;
    identify non-native format graphical PMI annotation information based on the determined annotation objects, wherein the non-native format graphical PMI annotation information is configured to visually present information to a user;
    add the identified non-native format graphical PMI annotation information to the native format CAD model; and
    preserve semantic PMI annotation information from the non-native format CAD model by:
      querying the determined annotation objects, using an application programing interface (API), to obtain the semantic PMI annotation information, the semantic PMI annotation information (i) corresponding to the identified non-native format graphical PMI annotation information and (ii) including one or more software-readable semantic PMI annotation objects; and
      storing the semantic PMI annotation information in the native format CAD model in one or more data structures configured to maintain relationships between the semantic PMI annotation information and the corresponding identified non-native format graphical PMI annotation information.

8. A system as in claim 7 wherein the processor is configured to display via the interface the native format CAD model with the identified non-native format graphical PMI annotation information.

9. A system as in claim 7 wherein the one or more data structures include a data structure for each type of semantic PMI annotation information.

10. A system as in claim 9 wherein the types of semantic PMI annotation information include dimension, datum, and geometric dimension and tolerancing information.

11. A system as in claim 9 wherein each of the one or more data structures includes a list of annotation instances for a given type of semantic PMI annotation information.

12. A system as in claim 11 wherein each annotation instance in a list of annotation instances for a given type of semantic PMI annotation information includes data specific to the type of semantic PMI annotation information.

13. A computer-aided design (CAD) system including a processor and a memory with computer code instructions stored thereon, the computer code instructions, when loaded, causing the processor to support an application programming interface (API) comprising:
  routines configured to:
    (i) access data structures associated with a native format CAD model and including non-native format semantic product manufacturing information (PMI) annotations and corresponding non-native format graphical PMI annotations, wherein the non-native format graphical PMI annotations are configured to visually present information to a user and the data structures are configured to maintain pre-existing relationships, from a non-native format CAD model, between the non-native format semantic PMI annotations and the corresponding non-native format graphical PMI annotations; and
    (ii) return the non-native format semantic PMI annotations stored in the data structures associated with the native format CAD model, the non-native format semantic PMI annotations including one or more software-readable semantic PMI annotation objects.

14. A CAD system as in claim 13 wherein the application programming interface further includes a routine configured to identify whether an annotation of the native format CAD model includes a data structure storing non-native format semantic PMI annotation information.

15. A CAD system as in claim 13 wherein the application programming interface further includes a routine configured to identify a type of an annotation of the native format CAD model that includes a data structure storing non-native format semantic PMI annotation information.

16. A non-transitory computer program product for preserving semantic product manufacturing information (PMI) annotation information of computer-aided design (CAD) annotations from a non-native format CAD model, the computer program product comprising a computer-readable medium with computer code instructions stored thereon, the computer code instructions being configured, when executed by a processor, to cause an apparatus associated with the processor to:
  create a native format CAD model from the non-native format CAD model;
  parse the non-native format CAD model to determine annotation objects associated with features or components of the non-native format CAD model;

identify non-native format graphical PMI annotation information based on the determined annotation objects, wherein the non-native format graphical PMI annotation information is configured to visually present information to a user;

add the identified non-native format graphical PMI annotation information to the native format CAD model; and preserve semantic PMI annotation information from the non-native format CAD model by:

querying the determined annotation objects, using an application programing interface (API), to obtain the semantic PMI annotation information, the semantic PMI annotation information (i) corresponding to the identified non-native format graphical PMI annotation information and (ii) including one or more software-readable semantic PMI annotation objects; and storing the semantic PMI annotation information in the native format CAD model in one or more data structures configured to maintain relationships between the semantic PMI annotation information and the corresponding identified non-native format graphical PMI annotation information.

17. A non-transitory computer program product as in claim 16 wherein the one or more data structures include a data structure for each type of semantic PMI annotation information.

18. A non-transitory computer program product as in claim 17 wherein the types of semantic PMI annotation information include dimension, datum, and geometric dimension and tolerancing information.

19. A non-transitory computer program product as in claim 17 wherein each of the one or more data structures includes a list of annotation instances for a respective type of semantic PMI annotation information.

20. A non-transitory computer program product as in claim 19 wherein each annotation instance in a list of annotation instances for a given type of semantic PMI annotation information includes data specific to the given type of semantic PMI annotation information.

* * * * *